United States Patent [19]

Skelton

[11] Patent Number: 5,710,495
[45] Date of Patent: Jan. 20, 1998

[54] APPARATUS AND METHOD FOR MEASURING AVERAGE MOTOR CURRENT

[75] Inventor: Dale J. Skelton, Plano, Tex.

[73] Assignee: Texas Instruments Incorporated, Dallas, Tex.

[21] Appl. No.: 702,416

[22] Filed: Aug. 14, 1996

[51] Int. Cl.$^6$ .................................................. H02K 29/04
[52] U.S. Cl. .................... 318/434; 318/432; 318/599
[58] Field of Search ........................... 318/138, 139, 318/245, 254, 280–290, 430–460, 599, 800–832; 388/800–824; 363/39, 40

[56] References Cited

U.S. PATENT DOCUMENTS

| | | | |
|---|---|---|---|
| 3,808,481 | 4/1974 | Rippel | 318/139 |
| 4,074,175 | 2/1978 | Born et al. | 318/432 |
| 4,176,307 | 11/1979 | Parker | 318/798 |
| 4,190,793 | 2/1980 | Parker et al. | 318/800 |
| 4,234,802 | 11/1980 | Bock . | |
| 4,284,938 | 8/1981 | Bailey | 318/432 |
| 4,471,283 | 9/1984 | Presley | 318/696 |
| 5,341,286 | 8/1994 | Inoue et al. | 363/98 |
| 5,436,545 | 7/1995 | Bahr et al. | 318/727 |
| 5,475,293 | 12/1995 | Sakai et al. | 318/802 |
| 5,497,326 | 3/1996 | Berland et al. | 318/488 |
| 5,502,365 | 3/1996 | Nanbu et al. | 318/798 |

*Primary Examiner*—Paul Ip
*Attorney, Agent, or Firm*—W. James Brady, III; Richard L. Donaldson

[57] ABSTRACT

Apparatus and method (10, 40) for measuring an average motor current in a pulse width modulation driven motor are provided. A sensor (20) is coupled to the motor to measure a motor winding current. A first current source (26) generates a first current generally proportional to the motor winding current. A second current substantially proportional to a chopped output voltage is also produced and subtracted from the first current. A circuitry (28) receives the difference between the first and second currents and generates an output voltage indicative of the average motor current. The output voltage is chopped by a circuit (32, 34) that produces a waveform at substantially the same duty cycle and phase as the pulse width modulation waveform driving the motor.

15 Claims, 3 Drawing Sheets

APPARATUS AND METHOD FOR MEASURING AVERAGE MOTOR CURRENT

TECHNICAL FIELD OF THE INVENTION

This invention is related in general to the field of motor controllers. More particularly, the invention is related to apparatus and method for measuring the average motor current driven in a pulse width modulation (PWM) configuration.

BACKGROUND OF THE INVENTION

Electric motors have been advantageously driven by pulse width modulation (PWM) switching circuits for its power savings and small size. However, the average motor current, used in the control circuit, has not been satisfactorily and accurately measured by conventional circuits or methods.

One method has been to provide the sensed motor current to a track-and-hold circuit during the PWM "on" time. The peak voltage sensed is held, and a current source discharges the hold capacitor during the PWM "off" time to synthesize the down slope of the motor current. This method requires an accurate knowledge of the motor electrical parameters and further requires fine adjustment of the circuit parameters for acceptable accuracy. The discharge current also must be proportional to the difference between the battery voltage and the back EMF (electromagnetic frequency) of the motor.

Another method provides the sensed motor current to a track-and-hold circuit that holds the value of the sensed motor current at mid-PWM "on" time. The method works only if the ripple component of the sensed current is linear, so that the voltage across the hold capacitor is proportional to the average motor current. Further, mismatch in propagation delays and rise/fall times between the power switches and the track-and-hold circuit produces inaccuracies which are difficult to compensate for.

Digital computation of the average motor current has also been used. The average motor current is computed based on the measurement of the PWM-switched current and the sensed switch current. The digital computation must be done at real time and requires substantial post-processing.

SUMMARY OF THE INVENTION

Accordingly, there is a need for an accurate measurement of the average motor current without the above-enumerated disadvantages.

In accordance with the present invention, apparatus and method for measuring the average motor current is provided which eliminates or substantially reduces the disadvantages associated with prior circuits and methods.

In one aspect of the invention, apparatus for measuring an average motor current is provided. A sensor is coupled to the motor to measure a motor winding current, and a first current generally proportional to the motor winding current is generated in response thereto. A current source generates a second current substantially proportional to a chopped output voltage, which is subtracted from the first current. A circuitry receives the difference between the first and second currents and generates an output voltage indicative of the average motor current. The output voltage is chopped by a circuit that produces a waveform at substantially the same duty cycle and phase as the power switch driving the motor.

In another aspect of the invention, a method for measuring an average motor current through a motor driven by a pulse width modulation waveform is provided. The steps include the steps of sensing a motor winding current, generating a first current being proportional to said sensed motor winding current, and generating a second current being proportional to a chopped output voltage having substantially the same frequency and phase as said pulse width modulation waveform. The first and second currents are then subtracted and converted to an output voltage indicative of the average motor current. The output voltage are chopped at substantially the same rate and time as said pulse width modulation waveform to generate said second current.

The present apparatus and method uses an analog closed loop driven at the same PWM rate as the power switches. In this manner, the mismatches in propagation delays and rise/fall times can be adjusted easily. Knowledge of the electrical time constant of the motor is used to stabilized the control loop, but not for fine adjustment of the accuracy of the measured average current.

BRIEF DESCRIPTION OF THE DRAWINGS

For a better understanding of the present invention, reference may be made to the accompanying drawings, in which.

DETAILED DESCRIPTION OF THE INVENTION

Figure 1:
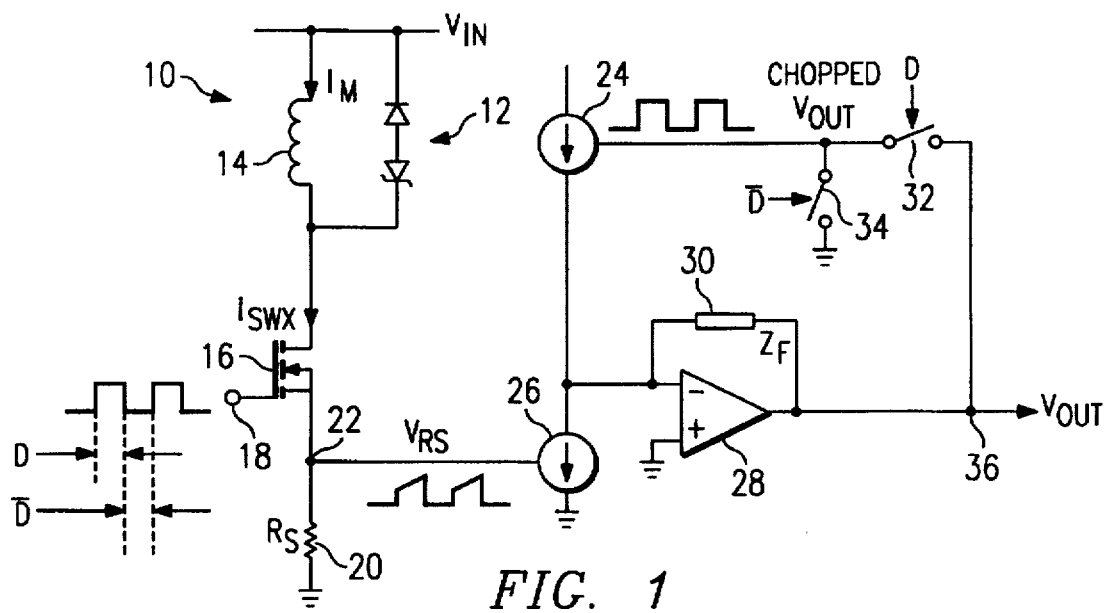
FIG. 1 is a simplified schematic of an embodiment of the present invention.

The preferred embodiment(s) of the present invention is (are) illustrated in FIGS. 1–5, like reference numerals being used to refer to like and corresponding parts of the various drawings.

In FIG. 1 showing a simplified circuit diagram of an embodiment 10 of the present invention, a motor current, $I_M$, flows through a diode circuit 12 and a motor winding 14 representing the bottom legs of a three-phase bridge coupled together (not shown), which is regulated by a transistor 16 functioning as a power switch. Power switch 16 may be implemented by an n-channel MOSFET, as shown. The current flowing into a drain terminal of power switch 16 is represented by $I_{SWX}$. The Power switch 16 receives a pulse width modulation (PWM) input signal, which turns it on and off. A sense resistor 20 is placed between ground and the power switch 16 to provide a voltage measurement, $V_{RS}$, across resistor 20 at node 22. Node 22 is coupled to a current source 26, which is in turn coupled to another current source 24. Current sources 24 and 26 have matched transconductances, $g_m$.

The two currents generated by current sources 24 and 26 are subtracted at a node 25, which is coupled to the inverting input of an operational amplifier 28. The non-inverting input of the operational amplifier 28 is coupled to ground. Operational amplifier 28 has a gain that is much greater than unity. A feedback loop including one or more circuit element(s) having an impedance, $Z_r$, is coupled between the output of operational amplifier 28 and its inverting input. The output 36 of operational amplifier 28 supplies the signal $V_{OUT}$, which is coupled to current source 24. Coupled between node 36 and current source 24 are switches 32 and 34 opening and closing at the same rate as power switch 16, which has the PWM duty cycle, D.

In operation, the voltage drop across sense resistor 20 is proportional to the motor winding current during the conduction, or "on" time, of power transistor 16. The current generated by current source 26 is made proportional to $I_{SWX}$, and the current generated by current source 24 is made proportional to a chopped $V_{OUT}$ from the output of operational amplifier 28. The chopped $V_{OUT}$ is chopped at the same rate as $I_{SWX}$ by closing switch 32 at the same time as power switch 16 on time (with switch 34 open substantially simultaneously), and closing switch 34 at the same time as power switch 16 off time (with switch 32 open substantially simultaneously). The loop gain is:

$$Gain = D * Z_F * g_m$$

The average output voltage, $V_{OUT(AVG)}$, is then:

$$V_{OUT(AVG)} = \frac{R_S * I_{M(AVG)}}{1 + 1/DZ_F g_m}$$

As long as the loop gain is much greater than unity, and the unity gain crossover of the loop is less than the PWM switching frequency, then the loop is stable and $V_{OUT(AVG)}$ becomes:

$$V_{OUT(AVG)} = R_S * I_{M(AVG)}$$

The average motor current, $I_{M(AVG)}$, then can be easily derived therefrom.

Figure 2A:
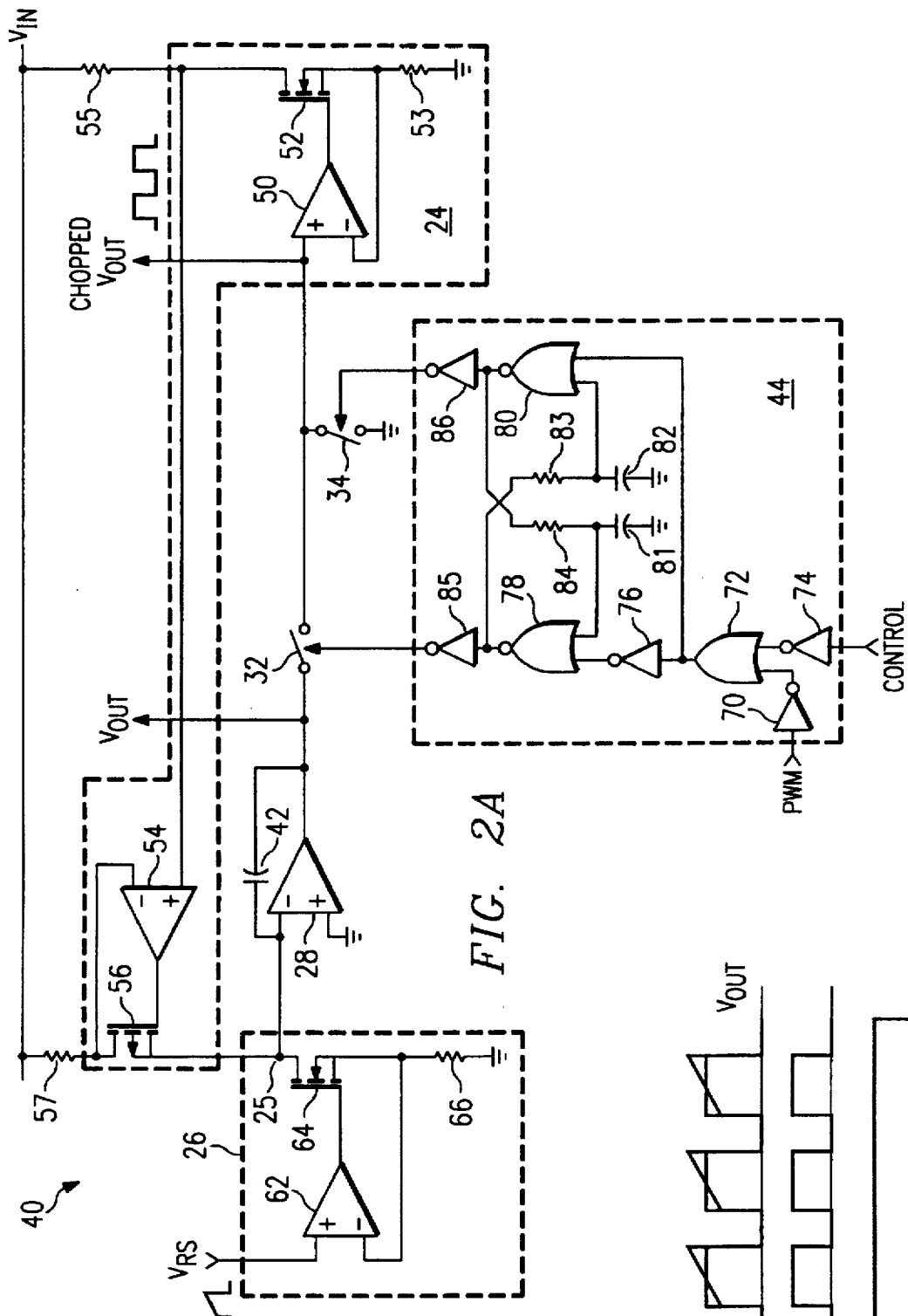
FIG. 2A is a circuit schematic of an embodiment of the present invention.

FIG. 2A is an exemplary implementation 40 of the concept shown in FIG. 1 constructed in accordance with the teachings of the present invention. Comparing with FIG. 1, the embodiment 40 includes current sources 24 and 26 coupled to a node 25, which is coupled to the non-inverting input of operational amplifier 28 with a feedback loop including a capacitor 42. Switches 32 and 34 for chopping $V_{OUT}$ are controlled by a logic circuit 44.

Current source 24 is a voltage to current source and includes a first operational amplifier 50 with its non-inverting input coupled to switches 32 and 34, which provides the signal, CHOPPED $V_{OUT}$. The output of operational amplifier 50 is coupled to a gate of an n-channel MOSFET 52. The inverting input of operational amplifier 50 is coupled to the source of transistor 52, which is coupled to ground through a resistor 53. The drain of transistor 52 is coupled to the non-inverting input of another operational amplifier 54, which is also coupled to through a resistor 55. The inverting input of operational amplifier 54 is coupled to the drain of a p-channel MOSFET 56, which is coupled to $V_{IN}$ through a resistor 57. The output of operational amplifier 54 is coupled to the gate of transistor 56, and the substrate thereof is coupled to node 25 at the inverting input of operational amplifier 28.

Voltage to current source 26 includes an operational amplifier 62 which receives chopped signal $V_{RS}$ from sense resistor 20 at its non-inverting input. Its inverting input is coupled to a source of an n-channel MOSFET 64, which is coupled to ground through a resistor 66. The output of operational amplifier 62 is coupled to a gate node of n-channel MOSFET 64, the drain of which is coupled to node 25.

Logic circuit 44, which controls the timing of switches 32 and 34, includes a number of logic gates and discrete components to open and close at substantially the same rate and time as the PWM duty cycle. Logic circuit 44 includes inverters 70 and 74 receiving the PWM signal and a CONTROL signal, respectively, the outputs of which are provided to the inputs of an OR gate 72. The output of OR gate 72 is coupled to an inverter 76, the output of which is coupled to an input of a NOR gate. The output of OR gate 72 is also coupled to an input of a NOR gate 80. A second input of NOR gate 78 is coupled to ground through a capacitor 81, and a second input of NOR gate 80 is also coupled to ground through another capacitor 82. The second input of NOR gate 80 is also coupled to the output of NOR gate 78 through a resistor 83, and the second input of NOR gate 78 is also coupled to the output of NOR gate 80 through another resistor 84. The outputs of NOR gates 78 and 80 are further provided to inputs of inverters 85 and 86, respectively. The outputs of inverters 85 an 86 control switches 32 and 34, respectively.

Figure 3:
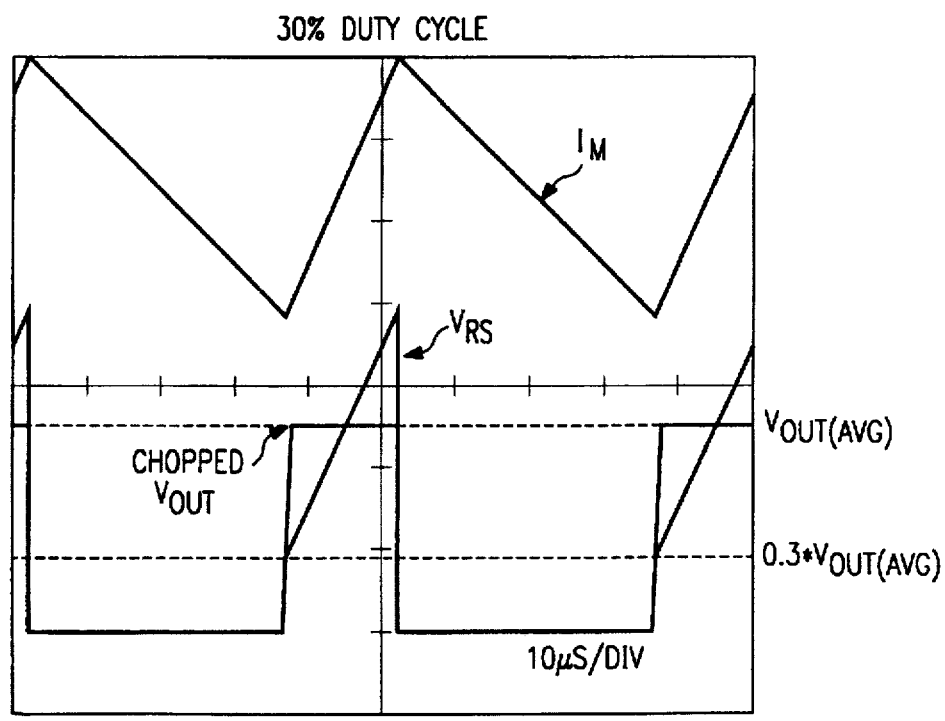
FIG. 3 is an exemplary plot comparing the measured average voltage with and without using the present invention.
Figure 2B:
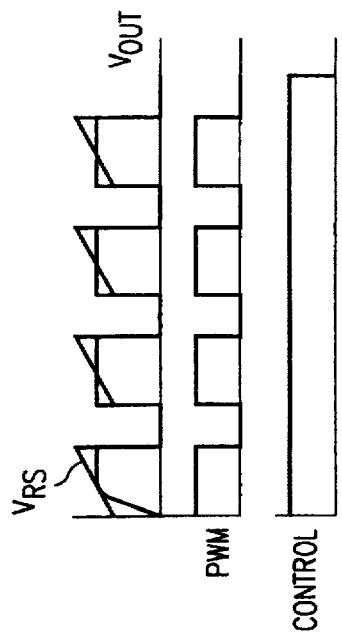
FIG. 2B is a timing diagram of selected signals.
Figure 4:
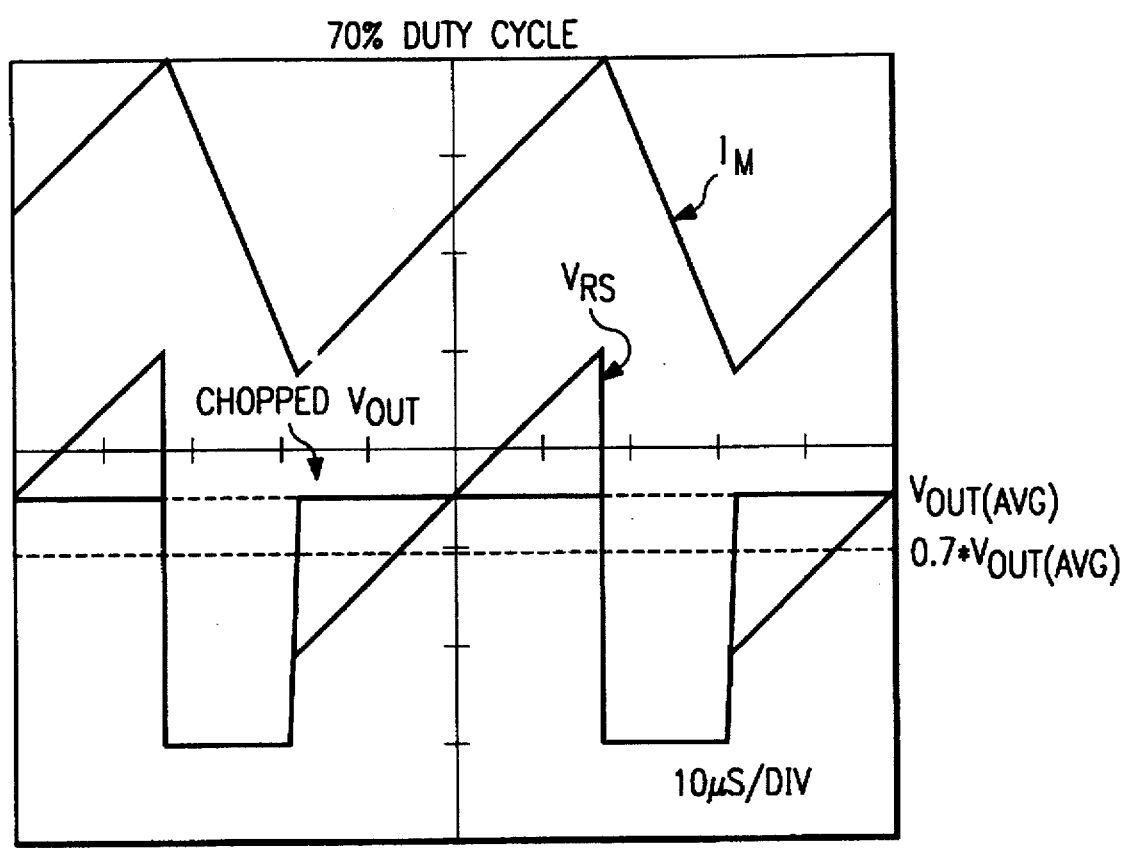
FIG. 4 is an exemplary plot comparing the measured average voltage with and without using the present invention.

Constructed in this manner, embodiment 40 operates as designed in accordance with the teachings of the invention illustrated in FIG. 1. FIG. 2B shows sample signal waveforms. Referring also to FIGS. 3 and 4, plots of $V_{OUT(AVG)}$ are shown at 30% and 70% duty cycles. When the instant circuit is not used, the measured output becomes a function of the duty cycle, and equals D * $V_{OUT(AVG)}$, where D is the duty cycle.

Although the present invention and its advantages have been described in detail, it should be understood that various changes, substitutions and alterations can be made therein without departing from the spirit and scope of the invention as defined by the appended claims.

What is claimed is:

1. Apparatus for measuring an average motor current of a motor regulated by a power switch switching at a predetermined duty cycle, comprising:

a sensor coupled to said motor measuring a switch current through said power switch;

a first current source coupled to said sensor and generating a first current substantially proportional to said switch current;

a second current source coupled to said first current source and generating a second current substantially proportional to a chopped output voltage;

first circuitry receiving a difference between said first and second currents and generating an output voltage indicative of said average motor current at an output node in response thereto; and second circuitry coupled to said second current source for chopping said output voltage into said chopped output voltage having the same predetermined duty cycle as said power switch.

2. The apparatus, as set forth in claim 1, wherein an average of said output voltage is:

$$V_{OUT(AVG)} = \frac{R_S * I_{M(AVG)}}{1 + 1/GAIN},$$

where $V_{OUT(AVG)}$ is the average output voltage, $R_S$ is a voltage drop across said sensor, $I_{M(AVG)}$ is the average motor current, and GAIN is a loop gain of the apparatus, which is much greater than one.

3. The apparatus, as set forth in claim 1, wherein said first and second current sources have matched transconductances.

4. The apparatus, as set forth in claim 1, wherein said second circuit comprises:

a first switch being coupled between said second current source and said output node of said first circuitry;

a second switch being coupled between said second current source and ground; and said first switch closing only when said power switch is on, and said second switch closing only when said power switch is off.

5. The apparatus, as set forth in claim 1, wherein said sensor includes a resistor.

6. The apparatus, as set forth in claim 1, wherein said first circuitry is a current to voltage converter.

7. The apparatus, as set forth in claim 1, wherein said first circuitry includes an operational amplifier receiving said difference between said first and second currents at an inverting input.

8. The apparatus, as set forth in claim 1, wherein an average of said output voltage is:

$$V_{OUT(AVG)} = \frac{R_S * I_{M(AVG)}}{1 + 1/DZ_F g_m}.$$

where $V_{OUT(AVG)}$ is the average output voltage, $R_S$ is a voltage drop across said sensor, $I_{M(AVG)}$ is the average motor current, D is the duty cycle of said power switch, $Z_F$ is a feedback impedance of said first circuitry, and $g_m$ is a matched transconductance of said first and second current sources.

9. Apparatus for measuring an average motor current in a motor driven in a pulse width modulation configuration by a PWM waveform, comprising:

a sense resistor coupled to said motor for measuring a motor winding current flowing through said motor;

a first current source coupled to said sense resistor generating a first current being proportional to said motor winding current;

a current to voltage converter receiving said first current and generating an output voltage indicative of said average motor current in response thereto;

circuitry for chopping said output voltage at substantially the same frequency and phase as said PWM waveform;

a second current source coupled to said chopping circuitry and said first current to voltage converter for generating a second current being proportional to said chopped output voltage; and said current to voltage converter receiving a difference between said first and second currents.

10. The apparatus, as set forth in claim 9, wherein an average of said output voltage is:

$$V_{OUT(AVG)} = \frac{R_S * I_{M(AVG)}}{1 + 1/GAIN},$$

where $V_{OUT(AVG)}$ is the average output voltage, $R_S$ is a voltage drop across said sense resistor, $I_{M(AVG)}$ is the average motor current, and GAIN is a loop gain of the apparatus, which is much greater than one.

11. The apparatus, as set forth in claim 9, wherein said first and second current sources have matched transconductances.

12. The apparatus, as set forth in claim 9, wherein said first circuitry includes an operational amplifier receiving said difference between said first and second currents at an inverting input.

13. The apparatus, as set forth in claim 9, wherein an average of said output voltage is:

$$V_{OUT(AVG)} = R_S * I_{M(AVG)}$$

where $V_{OUT(AVG)}$ is the average output Voltage, $R_S$ is a voltage drop across said sense resistor, $I_{M(AVG)}$ is the average motor current, D is the duty cycle of said PWM waveform, $Z_F$ is a feedback impedance of said current to voltage converter, and $g_m$ is a matched transconductance of said first and second current sources.

14. A method for measuring an average motor current through a motor driven by a pulse width modulation waveform, comprising:

sensing a motor winding current;

generating a first current being proportional to said sensed motor winding current;

generating a second current being proportional to a chopped output voltage having substantially the same frequency and phase as said pulse width modulation waveform;

subtracting said first and second currents and converting to an output voltage indicative of said average motor current;

chopping said output voltage at substantially the same rate and time as said pulse width modulation waveform for generating said second current.

15. The method, as set forth in claim 14, wherein said output voltage is equal to an average voltage:

$$V_{OUT(AVG)} = \frac{R_S * I_{M(AVG)}}{1 + 1/GAIN},$$

where $V_{OUT(AVG)}$ is the average output voltage, $R_S$ is a voltage drop across a sense resistor used to detect said motor winding current, $I_{M(AVG)}$ is the average motor current, and GAIN is a loop gain, which is much greater than one.

* * * * *